United States Patent [19]
Paivinen et al.

[11] 4,212,100
[45] Jul. 15, 1980

[54] STABLE N-CHANNEL MOS STRUCTURE

[75] Inventors: John Paivinen, Bloomfield Hills, Mich.; Walter D. Eisenhower, Jr., Audobon, Pa; Ernest R. Helfrich, Richardson, Tex.

[73] Assignee: MOS Technology, Inc., Norristown, Pa.

[21] Appl. No.: 835,985

[22] Filed: Sep. 23, 1977

[51] Int. Cl.² .................................... B01J 17/00
[52] U.S. Cl. ................................ 29/571; 29/578; 357/23; 357/59
[58] Field of Search ................. 29/571, 578; 357/59

[56] References Cited

U.S. PATENT DOCUMENTS

| 3,958,323 | 5/1976 | De La Moneda | 357/59 |
| 4,074,300 | 2/1978 | Sakai | 357/59 |
| 4,114,256 | 9/1978 | Thibault | 29/571 |
| 4,115,914 | 9/1978 | Harari | 29/571 |

*Primary Examiner*—W. C. Tupman
*Attorney, Agent, or Firm*—Cooper, Dunham, Clark, Griffin & Moran

[57] ABSTRACT

An N-channel MOS integrated circuit device having a composite metal gate structure which has improved temperature stability. The gate structure uses a polysilicon layer to separate the conventional metal gate from the conventional underlying gate oxide. The metal gate and the polysilicon layer extend laterally at least to the lateral extent of the gate region. This composite metal gate structure improves the temperature stability of the IC, and may be used, for example, in read-only memory (ROM) applications. The polysilicon layer is formed without additional photolithographic steps.

2 Claims, 15 Drawing Figures

METAL GATE

SILICON GATE

STABLE N-CHANNEL MOS STRUCTURE

BACKGROUND OF THE INVENTION

The invention is in the field of semiconductor devices in general and integrated circuit semiconductor devices in particular. In one aspect it relates to improved temperature stability for such devices.

One type of IC, the read-only memory (ROM), comprises a matrix array of storage devices, each device permanently encoded to store either a digital "1" or "0". Read-only memories comprised of MOS integrated circuits are well known and consist of an MOS device at each matrix cross point location. Each MOS device can be made to be conductive or nonconductive, in response to coincident applied voltages, depending upon whether one wishes to define a digital "1" or "0". To code a digital "1", for a conductive device, the device is most commonly made with a thin oxide overlying the channel region. To code a digital "0", for a nonconductive device, the oxide is maintained thick over the underlying channel region, thereby in effect providing the device with a high threshold voltage characteristic so that the device remains nonconductive.

MOS devices include a gate, positioned on top of an insulating layer, which gate may be formed of a metal (usually aluminum) or conductive silicon. Although N-channel MOS silicon gate devices are preferred in many applications, in ROM applications, for example, N-channel aluminum gate devices are more desirable. When N-channel silicon gate devices are used for ROM applications, ohmic contact must be made with each individual MOS device in the ROM. This fact necessitates a considerably greater number of pre-ohmic openings, when compared to metal gate ROMs, to provide contact to each device and this consequently expands the area requirements for each MOS device on the ROM integrated circuit. Aluminum gate devices, on the other hand, need only be contacted once per column on the chip and consequently require a smaller area per device, or alternatively permit a greater number of devices on an equal size chip, when compared to a silicon gate device.

A major drawback, however, in the use of aluminum gate devices for ROM application is that aluminum gate devices generally, are not as suitable during temperature bias stress aging as are silicon gate devices. Temperature stability testing of large area integrated circuit capacitors, i.e., essentially the gate portion of an MOS device without associated source and drain regions using aluminum electrodes, indicates that under a positive voltage bias at 200° C., a voltage shift of one or more volts can be expected. Where integrated circuit capacitors are made with conductive polysilicon instead of aluminum, testing under the same conditions reveals a maximum voltage shift of 0.2 volts. It is believed that the aluminum electrode injects electrons (and thus stores charge) into a "dead area", i.e., the oxide layer. A theoretical model derived from capacitance-voltage measurements is disclosed, for example, in White et al., *A Study Relating MOS Processes to a Model of the Al-SiO₂-Si System*, National Bureau of Standards Special Publications No. 337, dated 1970. A capacitance-voltage (CV) curve is generated, by applying a voltage ramp to an MOS capacitor, and measuring capacitance versus voltage. If time, temperature, stress, etc., are held constant, the CV curve can be, for a specific device, exactly reproduced. If some condition, e.g., temperature, changes the curve, the MOS capacitor is generally considered unstable and consequently undesirable for the present application.

Based on believing that an aluminum electrode is an injecting contact whereas a polysilicon electrode is not (or is, at least, less effective as such) it has been proposed to use a thin layer portion of polysilicon in the gate area of an N-channel aluminum gate MOS device, i.e., underneath the aluminum gate layer portion. There is, however, one further constraint in using such a composite metal gate structure: it is desirable not to introduce additional photolithographic steps which would increase processing cost and complexity and would further require tight registration between the polysilicon and metal masks. Moreover, it would be desirable to maintain the high performance of standard metal gate processes, i.e., high gain and low body effect.

The use of a structure of polysilicon and aluminum layers is discussed in Bellier et al., *An Improved Process for Silicon Transistors*, Extended Abstracts, Volume 73-1, Abstract 125, 1973 and Duncan, U.S. Pat. No. 3,740,835, but for entirely different reasons than the subject invention. In Bellier et al., polysilicon is deposited prior to aluminum deposition in a bipolar transistor in the ohmic regions for the purpose of eliminating silicon dissolution pits under metal contacts. In Duncan, a layer of polysilicon is deposited, at least in the ohmic areas and preferably over the oxide surface of a bipolar transistor, followed by a layer of aluminum to allow good ohmic contact to shallow semiconductor regions. Thus, the layered structure of polysilicon and aluminum which have been mentioned in the literature have been for a different purpose and in a different setting from this invention, which is directed to a particular type of composite structure of polysilicon and aluminum in the gate area of an MOS device, for a purpose different from this prior art, and teaches removal of the polysilicon from the ohmic regions. A process disclosed in Paivinen et al., U.S. Pat. No. 4,011,105, for example, may be modified to achieve the desirable ends of this invention.

SUMMARY OF THE INVENTION

The invention is in the field of semiconductor and integrated circuit structures and is specifically directed to MOS integrated circuits having improved temperature stable composite gate structures.

In accordance with the invention, it has been found that a layer of polysilicon divided into portions disposed over the insulating layer portion at the channel region of an N-channel MOS metal gate device increases the stability of the MOS device with respect to temperature bias because, it is believed, this decreases the effectiveness of the aluminum gate as an injecting contact. A layer of polysilicon, e.g. approximately 1500 A thick, is disposed over the gate insulating layer to extend laterally at least to the lateral extent of the underlying channel region. A conventional aluminum gate is disposed over each portion of the polysilicon layer to extend laterally at least to the lateral extent of the underlying polysilicon layer portion.

The invention is applied to making an improved temperature stable N-channel MOS IC having a composite metal gate structure by providing a P-type silicon substrate whose resistivity is of the order of, e.g. 10–20 ohm-cm, forming a first uniform thin oxide layer and introducing, e.g. ion-implanting, a P-type dopant through the first oxide layer to form immediately thereunder a uniform layer of P+-type semiconductor material extending laterally along the major surface of the substrate. A second uniform thick oxide layer is formed over the major surface of the substrate, and selected laterally spaced apart portions of the first and second oxide layers are removed to expose the substrate areas which will be the active areas, i.e., the areas for the source, drain and gate of each MOS device. At this point, a second introduction, e.g. ion-implantation, of P-type (N-type) dopant may be carried out to set the enhancement (depletion) level at selective active areas. A layer of polysilicon is formed extending laterally over the structure. Selected portions of the polysilicon are removed to leave over each gate region a polysilicon layer portion extending laterally at least to the lateral extent of the gate region, and to form pre-ohmic openings to each of at least some of the source and drain regions. A metal layer is disposed, e.g. vacuum deposited, over the structure. Selected portions of this metal layer are removed to leave over each gate region a metal layer portion disposed over the polysilicon layer portion and extending laterally at least to the lateral extent of the gate region, and to leave electrical interconnects to make ohmic contacts for selected ones of the source and drain regions. The aluminum metallization also serves as an etching mask for the polysilicon layer and thus the remaining polysilicon later after etching, is perfectly aligned with the aluminum metallization and no additional photolithographic steps are required.

In an alternate process of the invention for making an improved temperature stable MOS integrated circuit having a composite metal gate, a suitable P-type silicon substrate is again provided. A uniform thin oxide layer followed by a substantially thicker oxide layer are formed over the major surface of the substrate. Selected laterally spaced apart portions of the oxide layers are removed to expose source and drain regions. At this point the source and drain regions are doped and the doping driven in further into the substrate, the oxide is thinned down and a thin oxide layer is formed extending laterally over the entire structure. A P-type dopant is ion-implanted through the oxide layers to form immediately thereunder a layer of P+-type semiconductor material extending laterally along the major surface of the substrate. The subsequent steps of forming the gate, polysilicon layers and metal layer are identical to those described above in the first process.

DETAILED DESCRIPTION

Figure 1A:
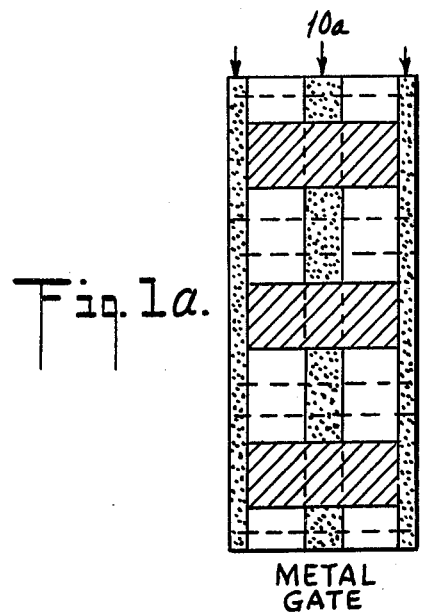
FIG. 1a illustrates a section of a typical silicon gate ROM cell which is a part of an MOS IC.
Figure 1B:
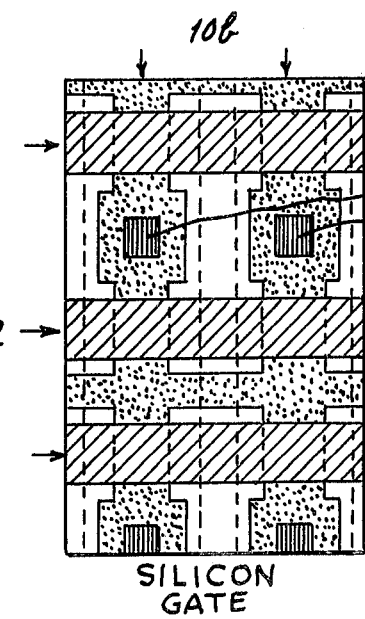
FIG. 1b illustrates a section of a typical metal gate ROM cell which is a part of an MOS IC.

FIGS. 1a and 1b depict a portion of a typical MOS IC read-only memory circuit in silicon gate and metal gate implementation, respectively. In the metal gate structure of FIG. 1a, diffusion columns 10a are continuous and thus need only be contacted once per column. In the silicon gate structure of FIG. 1b, polysilicon rows 12, of which material the gates are formed, are deposited prior to diffusions 10b and thus each island of diffusion 10b must be individually contacted. This necessitates an expansion of each ROM cell to accomodate pre-ohmic openings 14.

Figure 2:
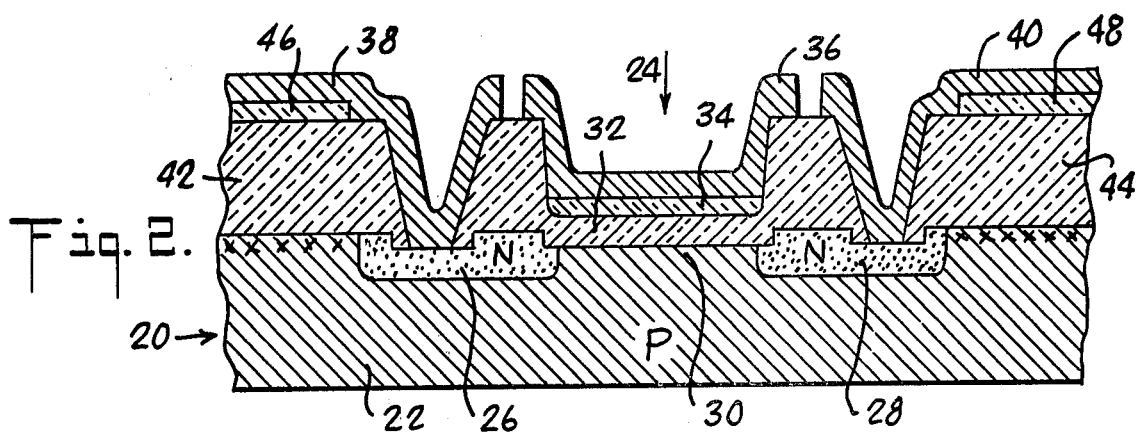
FIG. 2 is a section through a portion of an integrated circuit made in accordance with the invention.

FIG. 2 shows an exemplary portion of an integrated circuit structure made in accordance with the invention. The shown portion includes an N-channel MOS device which may be either an enhancement or a depletion device. FIG. 2 shows only a broken-off portion comprising one device of a larger integrated circuit, and it should be clear that the other MOS devices, and any other integrated circuit components, such as other active or passive devices, may be disposed along the same surface of the substrate to form an integrated circuit structure. Further, the invention as described in detail below is applied to an improved temperature stable composite metal gate structure in N-channel MOS integrated circuit devices. It should be clear, however, that the invention is applicable to other processes and devices where temperature stability is a problem and can be controlled by a composite metal gate structure.

Referring to FIG. 2 the illustrated portion 20 of an integrated circuit includes a P-type silicon substrate 22 and an N-channel MOS device 24. The MOS device 24 comprises a source region 26, a drain region 28, both of which are N-type material, and a channel region 30. There is a gate oxide 32 over the channel region 30. A polysilicon layer portion 34 overlays at least that portion of that gate oxide 32 that is over the channel region 30, and a standard aluminum gate 36 is disposed over the polysilicon layer portion 34 and extends laterally at least to the lateral extent of the underlying polysilicon layer portion 34. The polysilicon layer portion 34 and the aluminum gate 36 form a composite metal gate structure which provides a particularly desirable temperature stability characteristic. The polysilicon layer portion 34 is preferred to be approximately 1500 A thick, although in other embodiments of the invention the polysilicon layer portion 34 may be from 100 A to 4000 A thick. It is believed that when the polysilicon layer portion 34 forms a part of the composite metal gate structure, the aluminum layer portion 36 no longer functions as, or at least is greatly restricted in functioning as, an injecting contact.

The MOS device 24 further includes an electrical interconnect to the source region 26 through an aluminum layer 38. A corresponding aluminum layer 40 makes electrical contact to the drain region 28. Relatively thick field oxide layers 42 and 44 partially overlap the active areas, the source region 26 and drain region 28, respectively. The polysilicon layer 46 is sandwiched between aluminum layer 38 and oxide layer 42, and in a similar manner the polysilicon layer 48 is sandwiched between aluminum layer 40 and oxide layer 44. While the polysilicon layers 46 and 48 play no part in the desirable temperature stability characteristics of the device, maintaining the polysilicon layers 46 and 48 in place allows for processing facility in manufacturing the devices and eliminates the necessity for extra masking operations requiring tight registration with masks used in subsequent photomasking steps. Further, an added benefit in maintaining polysilicon layers 46 and 48 in place is that ohmic contact to the active areas, i.e., the source region 26 and the drain region 28, is improved since the polysilicon layers 46 and 48 provide a reservoir of silicon to satisfy the solubility in aluminum of silicon.

One process of making an improved temperature stable integrated circuit with a composite metal gate structure in accordance with the invention is illustrated in FIGS. 3-10. The starting material is <100> silicon wafer substrate whose dopant concentration is relatively low (and resistivity is relatively high). In the example of making N-channel MOS integrated circuit structures having a composite metal gate, the starting material is P-type silicon whose resistivity is of the order 10–20 ohm-cm. After conventional preparation, the substrate 22 is oxidized thermally to grow a silicon dioxide layer 60, which is about 1000 A thick and substantially uniform through the top major surface of the substrate 22. A P-type dopant, such as boron, is ion-implanted through the oxide layer 60 to form immediately thereunder a uniform P+-type layer 64 extending laterally along the top major surface of the substrate 22, whose dopant concentration is considerably higher than that of the substrate 22, e.g., the dopant concentration is sufficient for the resistivity of the layer 64 to be of the order of 1 or 2 ohm-cm.

Figure 3:
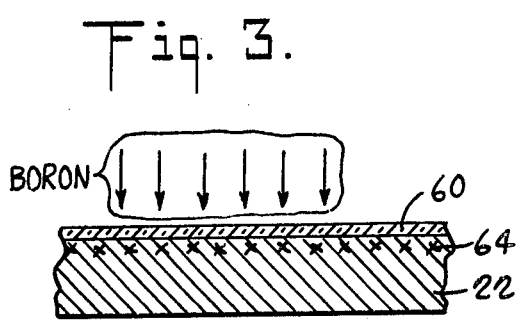
FIGS. 3-10 are sections illustrating steps in the process of making the structure shown in FIG. 2.
Figure 4:
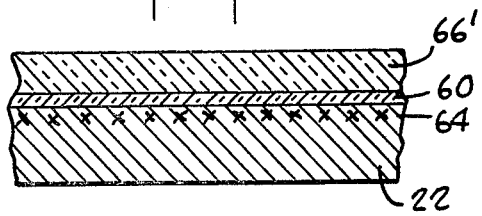
Figure 5:
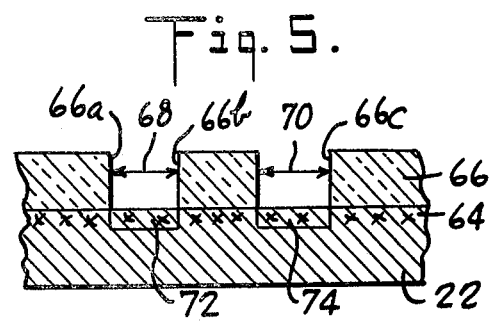

After the P+-type layer 64 has been implanted as shown in FIG. 3, a uniform silicon dioxide layer 66' which is about 5000 A thick is deposited over the thin oxide layer 60 by the Silox process at about 400° C. to form a structure of the type shown in FIG. 4. The newly deposited silicon dioxide layer 66' and oxide layer 60 are densified at about 950° C. for approximately 30 minutes to form a uniform silicon dioxide layer 66 which is about 6000 A thick. A photoresist pattern is deposited over the top surface of the thick oxide layer 66, and an opening is defined in the photoresist pattern to define the location of each integrated circuit component to be formed at the substrate 22. The silicon dioxide exposed through the windows of the photoresist mask is removed down to the top surface of the substrate 22, to form a structure of the type shown in FIG. 5, where the oxide layers 66a and 66c are the unremoved fields of the 6000 A thick uniform oxide layer 66 which overlays unremoved fields of P+-type material 64, where oxide layer 66b is the unremoved strip of the 6000 A thick uniform oxide layer 66, which overlays an unremoved strip of P+-type material 64, and where a pair of laterally spaced active areas 68 and 70 are opened to expose the P+-type layer 64. An N-type dopant, such as phosphorus, is diffused into the active areas 68 and 70 to define N-type regions 72 and 74 respectively. One active area of the pair will form the ultimate source region 26 and the drain region 28 will be formed at the other active area of the pair.

Figure 6:
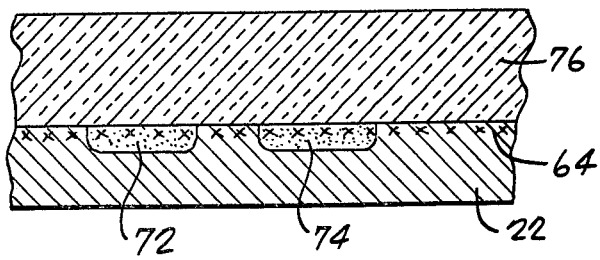
Figure 7:
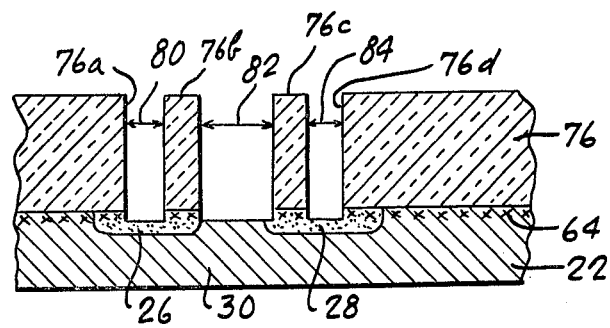

Following diffusion, as illustrated in FIG. 6, a silicon dioxide layer about 5000 A thick, is twice deposited over the major surface of the substrate 22 by the Silox process at about 400° C. Note that while the end result is a newly deposited oxide layer of 10,000 A, the deposition is performed in two separate steps to avoid volume change problems in the silicon dioxide by depositing too thick layers which might tend to crack. After each deposition of oxide the oxide is densified at about 950° C. for approximately 30 minutes. After the second densification a uniform silicon dioxide layer 76 is formed which is approximately 16,000 A thick. A photoresist pattern is deposited over the top surface of the oxide layer 76 and openings are defined in the photoresist pattern. The silicon dioxide exposed through the windows of the photoresist mask is removed down to the top surface of the substrate 22, and the exposed parts of the P+-type layer 64 are also removed, to form a structure of the type shown in FIG. 7, where the oxide layers 76a, 76b, 76c and 76d are the unremoved portions of the 16,000 A thick oxide layer 76. This forms windows 80 and 84 to the source region 26 and drain region 28, and a window 82 to the unimplanted substrate 22 at the channel region 30.

Figure 8:
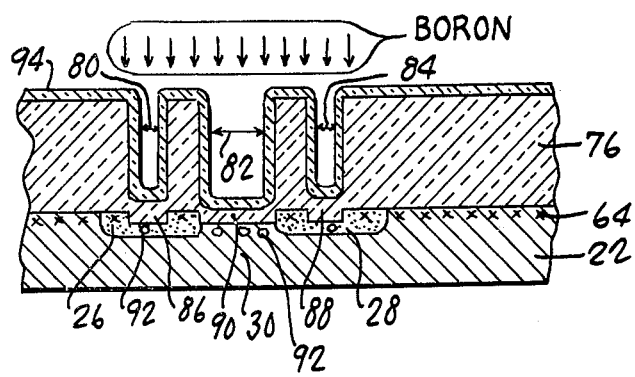
Figure 9:
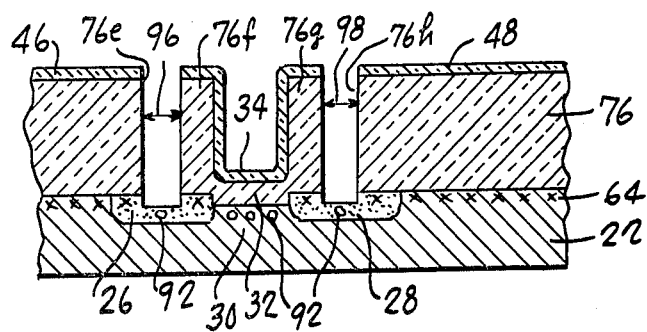
Figure 10:
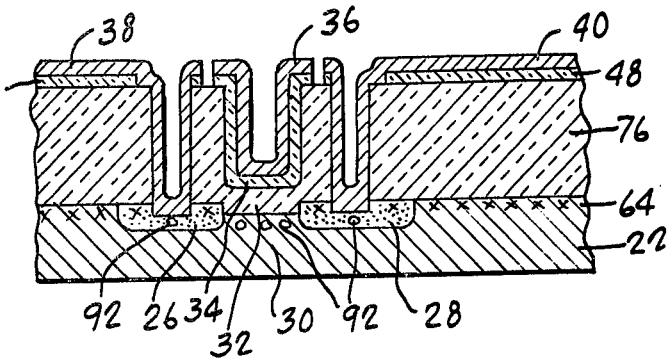
Figure 11:
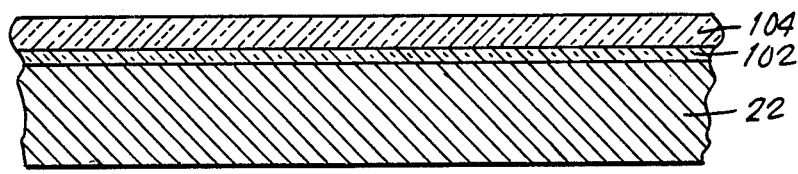
FIGS. 11-14 are sections partially illustrating alternate steps in the process of making the structure shown in FIG. 2.
Figure 12:
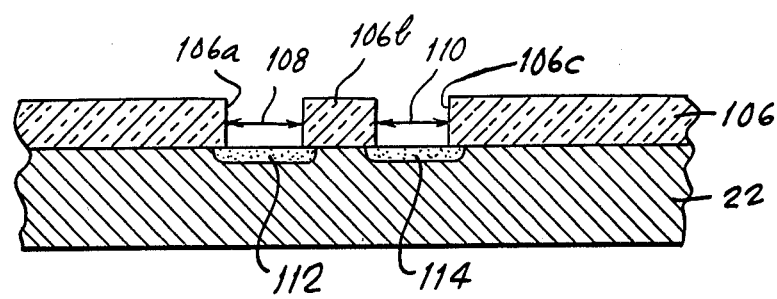

As illustrated in FIG. 8, thin oxide layers 86 and 88 (about 1900 A thick) are grown over the source region 26 and drain region 28 exposed through the windows 80 and 84, respectively. A thin oxide layer 90 (about 1000 A thick) is also grown over the channel region 30 exposed through window 82.

Following the oxidation of the gate, a P-type dopant, such as boron, is ion-implanted through the thin oxide layers 86, 88 and 90 to form doped layer portions 92 in the substrate, and provide for an enhancement type device. Up to this time the active areas of the substrate for depletion and enhancement devices have been processed in the same manner. In order to provide the additional dopant necessary for depletion devices, those active substrate areas which will be used for depletion devices may be ion-implanted using an N-type dopant, such as phosphorus to form a doped layer of the type that is necessary for a depletion device. Since enhancement devices are different from depletion devices only in the type of doping, depletion devices will not be discussed, with the understanding that depletion devices are made in accordance with the invention in the same manner except for the use of different doping materials.

After the area for an enhancement type device is prepared, the device is annealed at 950° C. in the presence of an inert gas specifically to reduce the interface states in the gate area comprised of oxide layer 90, although the entire top surface of the substrate 22 also undergoes annealing. A polysilicon layer 94, which is preferred to be approximately 1500 A thick, is deposited over the top of the entire structure. The polysilicon layer may, however, be anywhere from 100 A to 4000 A thick. The polysilicon layer 94 is thus deposited over the oxide layers 90, 86 and 88 in the channel area 30, source region 26, and drain region 28, respectively. A portion of the polysilicon layer 94 covering the oxide layer 90 above the channel region 30 forms the initial portion of the composite metal gate structure having the desirable temperature stability characteristics.

Following the polysilicon deposition, a photoresist pattern is deposited over the top surface of the polysilicon layer 94, and openings are defined in the photoresist pattern over portions of the source region 26 and drain region 28 to form suitable pre-ohmic openings. Parts of the polysilicon layer 94 and oxide layers 86 and 88 are removed to expose the N-type material at the source region 26 and drain region 28, respectively, to form a structure of the type shown in FIG. 9, where the oxide layers 76e, 76f, 76g and 76h are the unetched portions of the 16,000 A uniform oxide layer 76, polysilicon layers 46, 34 and 48 are the remaining portions of the polysilicon layer 94 and windows 96 and 98 expose portions of the source region 26 and drain region 28. The polysilicon layer portion 34 extends laterally at least to the lateral extent of the underlying channel region 30. An N-type dopant, such as phosphorus, may then be diffused into the source region 26 and drain region 28 to make the N-type material more conductive.

After the phosphorus diffusion, a metal blanket, usually made of aluminum, is vacuum deposited over the top surface of the structure for electrical contact to the source region 26 and drain region 28 and for forming metal gate contacts. The aluminum blanket is presintered for about 5 minutes at about 400° C. in forming gas (10% hydrogen and 90% nitrogen) to provide improved metallurgical bonding between the metal blanket and the polysilicon portions remaining on the substrate 22. Selected parts of the aluminum blanket and the underlying polysilicon are then removed by conventional masking and etching to leave portions such as 38, 36 and 40 shown in FIG. 10. The metal layer portion 36, disposed over the polysilicon layer portion 34, extends laterally at least to the lateral extent of the channel region 30 and together form the composite metal gate structure having the desirable temperature stability characteristics. Metal layer portions 38 and 40 form electrical interconnects for the source region 26 and drain region 28 respectively of the illustrated MOS device. Note that the aluminum metallization also serves as the etching mask for the remaining portions of the polysilicon layer 94, i.e., polysilicon layer portions 46, 34 and 48, so that after etching each portion is perfectly aligned with portions of the aluminum layers 38, 36 and 40. No additional photolithographic steps are required in this embodiment of the invention and consequently there is no increased process cost or complexity, nor is tight registration required with masks used in subsequent photomasking steps.

Following the etching of the aluminum and polysilicon, electrical contacts (not shown) are provided by conventional masking and etching, and a passivating silicon dioxide layer (not shown) about 5000 A thick is deposited over the entire structure, also in a conventional manner. As discussed above, the devices shown in FIGS. 2–10 are only portions of larger integrated circuit structures which include other devices of the illustrated type, perhaps depletion devices as well, and perhaps other active and passive integrated circuit components as well. While the steps required to code a specific pattern, i.e., a conductive or nonconductive device, to provide for a ROM device, have not been disclosed herein since they are conventional and well known, the composite metal gate structure disclosed herein may be advantageously utilized for such an application.

In an alternate process of the invention for making an improved temperature stable MOS integrated circuit having a composite metal gate structure, which is partially illustrated in FIGS. 11–14 and further illustrated, as in the earlier described process, in FIGS. 6–10, the starting material is a P-type <100> silicon wafer substrate having a resistivity of the order 10–20 ohm-cm. After conventional preparation, the substrate 22 is oxidized thermally to grow a silicon dioxide layer 102, which is approximately 1000 A thick and substantially uniform along the top major surface of the substrate 22. A silicon dioxide layer 104 which is about 4000 A thick is deposited over the thin oxide layer 102 by the Silox process at about 400° C. to form a structure of the type shown in FIG. 11. The newly deposited oxide layer 104 and oxide layer 102 are densified at about 950° C. for approximately 30 minutes to form a uniform silicon dioxide layer 106 which is about 5000 A thick. A photoresist pattern is deposited over the top surface of the thick oxide layer 106. Silicon dioxide exposed through the windows of the photoresist mask is removed down to the top surface of the substrate 22, to form a structure of the type shown in FIG. 12, where the oxide layers 106a and 106c are unremoved fields of the 5000 A thick uniform oxide layer 106, oxide layer 106b is an unremoved strip of the 5000 A thick uniform oxide layer 66 and a pair of laterally spaced active areas 108 and 110 are exposed at the top of the substrate layer 22. An N-type dopant, such as phosphorus, is diffused into the active areas 108 and 110 to define N-type regions 112 and 114, respectively, where one active area of the pair will be used as source region 26 and the other will be used as drain region 28. Following the initial phosphorus diffusion, the phosphorus is driven further into the substrate 22 in the active areas 108 and 110 by conventional methods so that the N-type dopant is not etched out of the source region 26 and drain region 28 when pre-ohmic openings are made in subsequent steps.

Figure 13:
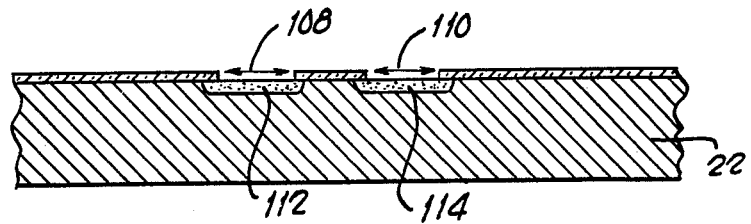
Figure 14:
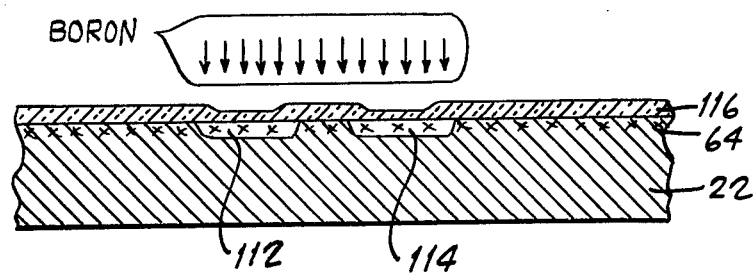

After the drive-in step, the oxide layer 106 is thinned down to approximately 500 A as illustrated in FIG. 13. A new oxide layer 116 is then deposited over the top surface of the substrate 22 to a thickness of approximately 1000 A. A P-type dopant, such as boron, is ion-implanted through the oxide layer 116 to form immediately thereunder a uniform P+-type layer 64 extending laterally along the top major surface of the substrate 22 and having dopant concentration considerably higher than that of the substrate 22. The subsequent steps in this alternate process for making the improved temperature stable MOS device having a composite metal gate are then carried on as illustrated in FIGS. 6–10 in a similar fashion to the steps described above.

We claim:

1. A method of making an MOS integrated circuit having improved temperature stability comprising the steps of:

providing a P-type silicon substrate and forming a first uniform thin oxide layer along a laterally extending top major surface of the substrate;

ion-implanting a P-type dopant through the first oxide layer to form immediately thereunder a uniform layer of P+-type semiconductor material extending laterally along said major surface of the substrate;

forming a second uniform thick oxide layer over the major surface of the substrate and removing selected laterally spaced-apart portions of the first and second oxide layers to leave a pattern of pairs of active areas of the substrate spaced laterally by unremoved fields of the first and second oxide layers and underlying fields of P+-type material, the active areas of each pair being laterally spaced apart by a strip of unremoved first and second oxide and an underlying strip of P+-type layer;

forming a source region at one of the active areas of each pair of active areas and a drain region at the other active area of the pair and forming a third thick oxide layer extending laterally over the major surface of the substrate;

removing at least a portion of the strip of first, second and third oxide layers over said strip of P+-type layer and removing at least a portion of said strip of P+-type layer to leave a pattern of unimplanted gate regions of the substrate, each gate region being laterally flanked by a source region and a drain region, and removing the third oxide layer over a portion of each source and drain region;

forming a fourth, thin oxide layer over each source region, drain region and gate region;

forming a layer of polysilicon extending laterally over the major surface of the substrate;

removing selected portions of the polysilicon layer to leave over each gate region a polysilicon layer portion extending laterally at least to the lateral extent of said gate region and removing the fourth, thin oxide layer over at least a portion of each of at least some of said source and drain regions; and forming a metal layer laterally disposed over the major surface of the substrate and removing selected portions of said metal layer to leave over each gate region a metal layer portion disposed over the polysilicon layer portion and extending laterally at least to the lateral extent of the gate region and to leave electrical interconnects to selected ones of said regions.

2. A method of making an MOS integrated circuit having improved temperature stability comprising the steps of:

providing a silicon substrate, forming a first, uniform, thin oxide layer along a laterally extending top major surface of the substrate and forming a second, substantially thicker oxide layer over the first oxide layer;

removing selected laterally spaced-apart portions of the first and second oxide layers to leave a pattern of pairs of active areas of the substrate spaced laterally by unremoved fields of the first and second oxide layers, the active areas of each pair being laterally spaced apart by a strip of unremoved portions of the first and second oxide layers;

forming a source region at one of the active pairs of each pair of active areas and a drain region at the other active area of the pair;

driving-in the source region and the drain region further into the respective active areas, and forming a third, thin oxide layer extending laterally over the major surface of the substrate;

ion-implanting a P-type dopant through the first, second and third oxide layers to form immediately thereunder a layer of $P^+$-type semiconductor material extending laterally along said major surface of the substrate, and forming a fourth, thick oxide layer extending laterally over the third oxide layer;

removing at least a portion of the strip of first, second, third and fourth oxide layers over said strip of $P^+$-type layer and removing at least a portion of said strip of $P^+$-type layer to leave a pattern of unimplanted gate regions of the substrate, each gate region being laterally flanked by a source region and a drain region, and removing the third and fourth oxide layers over a portion of each source and drain region;

forming a fifth, thin oxide layer over each source region, drain region and gate region;

forming a layer of polysilicon extending laterally over the major surface of the substrate;

removing selected portions of the polysilicon layer to leave over each gate region a polysilicon layer portion extending laterally at least to the lateral extent of said gate region and removing the fifth, thin oxide layer over at least a portion of each of at least some of said source and drain regions; and forming a metal layer laterally disposed over the major surface of the substrate and removing selected portions of said metal layer to leave over each gate region a metal layer portion disposed over the polysilicon layer portion and extending laterally at least to the lateral extent of the gate region and to leave electrical interconnects to selected ones of said regions.

* * * * *